United States Patent
Shackleton (10) Patent No.: US 11,387,098 B2
(45) Date of Patent: Jul. 12, 2022

(54) DISPENSER GUARD AND METHOD OF MANUFACTURING AN ARTICLE

(71) Applicant: CANON KABUSHIKI KAISHA, Tokyo (JP)

(72) Inventor: Steven C. Shackleton, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/719,778

(22) Filed: Dec. 18, 2019

(65) Prior Publication Data

US 2021/0193462 A1 Jun. 24, 2021

(51) Int. Cl.
| | |
|---|---|
| B05B 14/00 | (2018.01) |
| B05B 14/30 | (2018.01) |
| B05C 11/10 | (2006.01) |
| G03F 7/00 | (2006.01) |
| B41J 2/14 | (2006.01) |
| B41J 2/185 | (2006.01) |
| H01L 21/02 | (2006.01) |
| H01L 21/027 | (2006.01) |
| B82Y 40/00 | (2011.01) |
| B05B 17/06 | (2006.01) |
| B05C 5/02 | (2006.01) |
| B05B 1/28 | (2006.01) |
| B41J 2/165 | (2006.01) |
| B05B 12/36 | (2018.01) |

(52) U.S. Cl.
CPC ......... *H01L 21/02282* (2013.01); *B05B 1/28* (2013.01); *B05B 14/00* (2018.02); *B05B 14/30* (2018.02); *B05B 17/06* (2013.01); *B05C 5/0291* (2013.01); *B05C 11/1039* (2013.01); *B82Y 40/00* (2013.01); *G03F 7/0002* (2013.01); *H01L 21/027* (2013.01); *B05B 12/36* (2018.02); *B41J 2002/14362* (2013.01); *B41J 2002/16502* (2013.01); *B41J 2002/1853* (2013.01)

(58) Field of Classification Search
None
See application file for complete search history.

(56) References Cited

U.S. PATENT DOCUMENTS

| | | | | |
|---|---|---|---|---|
| 4,994,825 | A | * | 2/1991 | Saito .............. B41J 2/1433 347/47 |
| 6,561,617 | B2 | | 5/2003 | Silverbrook |
| 6,834,931 | B2 | | 12/2004 | Ang et al. |
| 6,942,315 | B2 | | 9/2005 | Silverbrook |
| 7,267,428 | B2 | | 9/2007 | Silverbrook |

(Continued)

OTHER PUBLICATIONS

11.8 Cohesion and Adhesion in Liquids_Surface Tension and Capillary Action—College Physics chapters 1-17; http://pressbooks-dev.oer.hawaii.edu/collegephysics/chapter/11-8-cohesion-and-adhesion-in-liquids-surface-tension-and-capillary-action/(Year: 2021).*

*Primary Examiner* — Binu Thomas
(74) *Attorney, Agent, or Firm* — Canon U.S.A., Inc. IP Division (57) ABSTRACT

A fluid dispenser, comprising a dispenser faceplate having at least one ejection port and a dispenser guard. The dispenser guard has at least one opening configured to allow fluid exiting from the ejection port to flow through and at least one drainage structure. The dispenser guard is spaced from the ejection port with a gap small enough to attract the fluid accumulated around the ejection port to flow into the drainage structure.

15 Claims, 9 Drawing Sheets

(56) References Cited

U.S. PATENT DOCUMENTS

| | | | |
|---|---|---|---|
| 7,275,802 B2 | 10/2007 | Berardelli et al. | |
| 7,455,387 B2 | 11/2008 | Cunnington et al. | |
| 7,891,769 B2 | 2/2011 | Silverbrook | |
| 8,529,015 B2 | 9/2013 | Williams et al. | |
| 2004/0061745 A1 | 4/2004 | Salzer | |
| 2006/0197810 A1* | 9/2006 | Anagnostopoulos | B41J 2/185 347/74 |
| 2006/0227171 A1 | 10/2006 | Silverbrook et al. | |
| 2009/0033727 A1* | 2/2009 | Anagnostopoulos | B41J 2/02 347/90 |
| 2009/0244180 A1* | 10/2009 | Panchawagh | B41J 2/02 347/44 |
| 2010/0102471 A1* | 4/2010 | Truskett | G03F 7/0002 264/40.7 |
| 2011/0199432 A1* | 8/2011 | Sakata | B41J 2/1721 347/44 |
| 2011/0234698 A1* | 9/2011 | Sakata | B41J 2/17596 347/85 |
| 2013/0141491 A1* | 6/2013 | Krichtman | B41J 2/165 347/30 |
| 2019/0232662 A1* | 8/2019 | Yamamoto | B41J 2/17596 |

* cited by examiner

DISPENSER GUARD AND METHOD OF MANUFACTURING AN ARTICLE

BACKGROUND

Field of Art

The present disclosure relates to substrate processing, and more particularly, to a dispenser guard of a material dispenser.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate; therefore nano-fabrication becomes increasingly important. Nano-fabrication provides for greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating one or more layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into and/or onto an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, formable material removal, dicing, bonding, packaging, and the like.

SUMMARY

A fluid dispenser is provided. The fluid dispenser includes a dispenser faceplate, which has at least one ejection portion. The fluid dispenser further includes a dispenser guard having at least one opening configured to allow fluid exiting from the ejection port to flow through. The dispenser guard is spaced from the faceplate with a distance small enough to attract the fluid accumulated around the ejection port of the chuck. Preferably but optionally, the gap between the faceplate and the dispenser guard is less than about 100 µm. The dispenser guard has a thickness smaller than 200 µm. The dispenser guard includes a drainage structure, for example, a trench, formed at a peripheral region thereof to drain the accumulated fluid away from the faceplate. The faceplate or dispenser guard comprises a plurality of geometric structures such as ribs defining a plurality of channels surrounding the opening. The plurality of ribs comprises at least two rows of first ribs arranged along an elongate direction of the opening and at least two column of second ribs arranged at two lateral sides of the opening.

Each of the first ribs elongates perpendicularly to the elongating direction, and each of the second ribs elongates in parallel with the elongate direction. The fluid dispenser may further comprise a row of ejection ports. The opening of dispenser guard extends along the row of ejection ports, and the dispenser guard comprises a plurality of ribs surrounding the opening. The ribs may comprise at least two rows of ribs arranged along two respective elongate sides of the opening and at least two columns of ribs arranged along two respective lateral sides of the opening.

The fluid dispenser may further comprise a plurality of rows of ejection ports. The dispenser guard comprises a plurality of openings each extending along a respective one of the rows of ejection ports and a plurality of ribs surrounding each of the rows of ejection ports is surrounded by the ribs. In one embodiment, the plurality of ribs comprises a plurality of rows of first ribs each being arranged along an elongate direction of the opening and a plurality of columns of second ribs each being arranged along a direction perpendicular to the elongate direction of the opening. The rows of first ribs and the columns of second ribs are so arranged that each of the opening slit is surrounded by the first ribs at two elongate sides and the second ribs along two lateral sides thereof. Each of the first ribs arranged between the two openings may have a length shorter than the other of the first ribs. The plurality of rows of first ribs and the openings may be alternately arranged along the direction perpendicular to the elongate direction of the opening between the columns of the second ribs. Alternatively, the plurality of columns of ribs includes a first array at a first lateral side of the openings and a second array at a second lateral side of the openings.

The dispenser guard may further comprise a wire mesh surrounding the opening. A negative pressure source may be configured to supply a negative pressure to a perimeter of the dispenser guard.

A method is provided. The method includes dispensing fluid from at least one ejection port of a fluid dispenser onto a substrate. The dispenser has a dispenser guard and positioned between a dispenser faceplate comprising the ejection port and the substrate, the dispenser guard including an opening allowing the fluid ejected from the ejection port to flow through, wherein the dispenser guard is spaced from the ejection port with a gap small enough to draw an accumulation of the fluid away from the ejection port and to a drainage structure formed at a peripheral region of the dispenser guard. The dispenser guard and the dispenser faceplate form a gap smaller than 100 µm. The dispenser guard may include a plurality of slits defining a plurality of ribs surrounding the opening. The method may further comprise applying a vacuum to the drainage structure to draw off the accumulation of fluid.

A method of manufacturing an article is provided. A formable material is dispensed from an ejection port of a dispensing surface of a fluid dispenser onto a substrate.

Accumulation of fluid on the dispensing surface may be attracted by a dispenser guard disposed in proximity of the dispensing surface. A vacuum is applied to a drainage structure of the dispenser guard to draw off the accumulation of fluid. A template is advanced to be in contact with the fluid dispensed on the substrate. The formable material is solidified to form a solid layer on the substrate that has a pattern conforming to a shape of the surface of the advanced template. The template is removed from the solidified layer. The substrate is processed with the solidified layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Nanoimprint System

Figure 1:
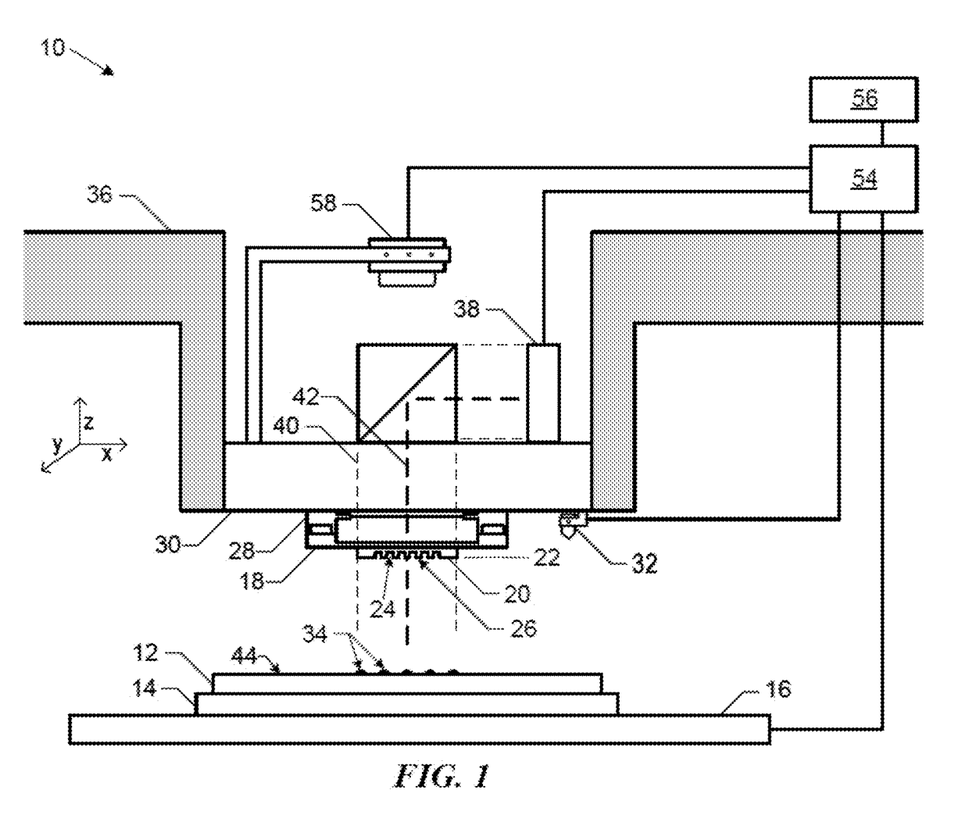
FIG. 1 is a diagram illustrating an apparatus.

FIG. 1 illustrates a nanoimprint lithography apparatus 10 in which an embodiment may be implemented. Apparatus 10 may be used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like.

Substrate 12 and substrate chuck 14 may be further supported by positioning stage 16. Stage 16 may provide translational and/or rotational motion along one or more of the x, y, z, θ, and φ axes. Stage 16, substrate 12, and substrate chuck 14 may also be positioned on a base (not shown).

Spaced-apart from substrate 12 is template 18. Template 18 may include a body having a first side and a second side with one side having a mesa 20 (also referred to as mold 20) extending therefrom towards substrate 12. Mesa 20 may have a patterning surface 22 thereon. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12. Alternatively, surface 22 may be blank, i.e. without pattern features, in which case a planar surface can be formed on the substrate. In an alternative embodiment, when the patterning surface 22 is of the same areal size as the substrate, a layer can be formed over the entire substrate (e.g., whole substrate processing).

Template 18 may be coupled to chuck 28. Chuck 28 may be configured as, but not limited to, vacuum, pin-type, groove-type, electrostatic, electromagnetic, and/or other similar chuck types. Further, chuck 28 may be coupled to head 30 which in turn may be moveably coupled to bridge 36 such that chuck 28, head 30 and template 18 are moveable in at least the z-axis direction.

Apparatus 10 may further comprise a fluid dispense system 32. Fluid dispense system 32 may be used to deposit formable material 34 (e.g., polymerizable material) on substrate 12. Formable material 34 may be positioned upon substrate 12 using techniques such as drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations.

Fluid dispense system 32 may use different technologies to dispense formable material 34. When the formable material 34 is capable of jetting, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

Apparatus 10 may further comprise radiation source 38 that directs actinic energy 40 along path 42. Imprint head 30 and stage 16 may be configured to position template 18 and substrate 12 in superimposition with path 42. Camera 58 may likewise be positioned in superimposition with path 42. Apparatus 10 may be regulated by processor 54 in communication with stage 16, head 30, fluid dispense system 32, source 38, and/or camera 58 and may operate on a computer readable program stored in memory 56.

Either head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces actinic energy 40 (e.g., ultraviolet radiation) causing formable material 34 to solidify and/or cross-link conforming to a shape of surface 44 of substrate 12 and surface 22 of template 18, defining a formed layer on substrate 12.

Material Dispensing Unit

Figure 2A:
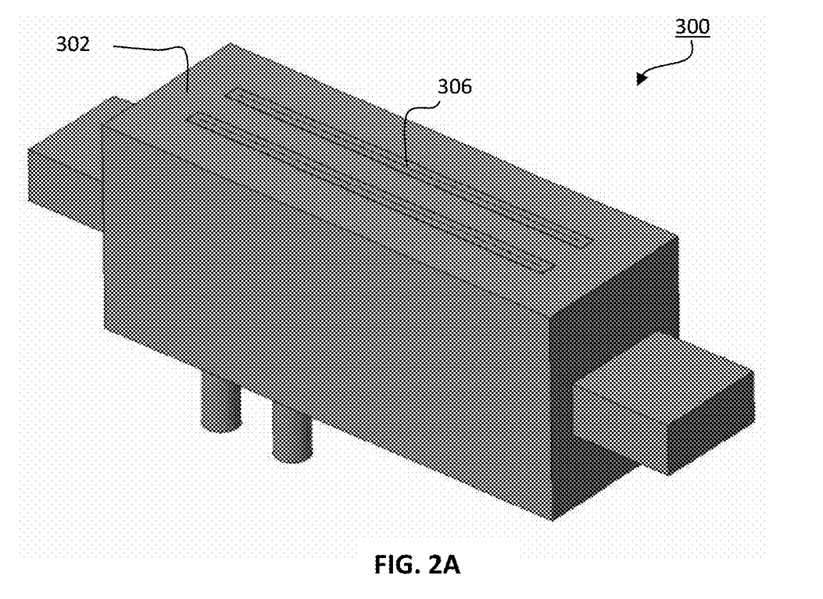
FIG. 2A to 2B illustrate a fluid dispenser.
Figure 2B:
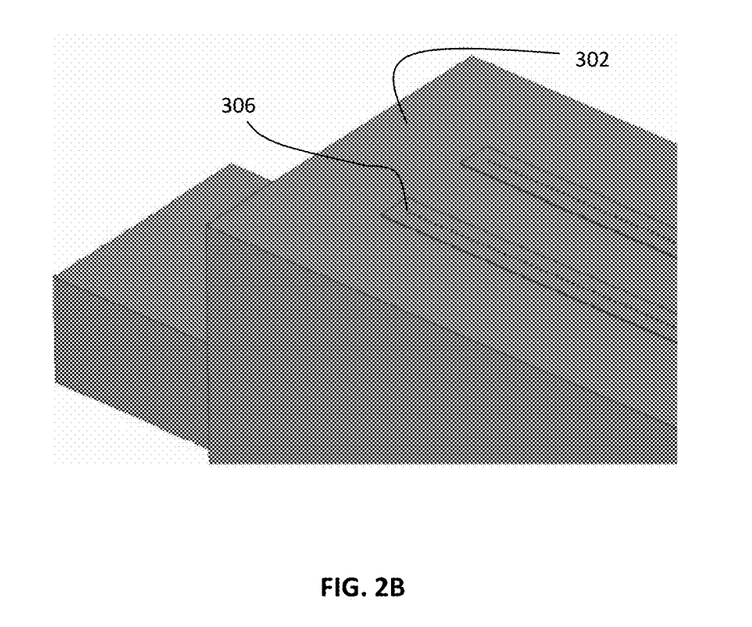

FIGS. 2A and 2B illustrate a dispenser 300 that uses e.g., piezoelectric material or thermal excitation to generate pressure to fire droplets of a formable material (e.g., a nanoimprint resist material) from an array of nozzles or ejection ports 306 onto a substrate, according to a desired drop dispense pattern. As depicted, the nozzles 306 are arrayed in two rows on the underside of dispenser 300. The dispenser 300 also includes a faceplate 302 that covers the underside of dispenser 300 includes an array of nozzles to allow for passage of dispensed droplets through faceplate 302. In an embodiment, the faceplate 302 can be a plastic, such as a polyimide, with the nozzle outlets integrally formed in the polyimide. The faceplate 302 can also be a dispensing surface of the dispenser 300. As discussed above, the formable material (or resist) may be dispensed in the form of droplets on the substrate for a nanoimprint process or other processes. During dispensing operations, extraneous resist fluid may accumulate on faceplate 302 of the dispenser 300. This accumulation can be caused by a number of factors including resist fluid pressure variation and/or resist vapor accumulation, which can cause a leaking of resist fluid from the nozzles. The fluid accumulation can also be exacerbated by fluid properties of nanoimprint resist itself. Nanoimprint resists are specifically designed to have a low contact angle and highly wetting to assist with fluid spreading during the imprint process. These properties in turn also can cause the resist to more readily wet the dispenser faceplate surface. Further, in the context of nanoimprint system 10, the dispenser 300 proximity to a substrate (or wafer) or wafer surface can be at 300 μm or less in order to achieve the required dispense drop volume and drop placement performance. As a result, when the fluid accumulation on faceplate 302 becomes excessive, the accumulated fluid thickness can be great enough to form a fluid bridge between the substrate and the dispenser faceplate, or alternatively, large drops of accumulated fluid can otherwise be released onto the substrate. In either case, unwanted resist fluid can either drip or wick out from the dispenser faceplate and on to the substrate in an uncontrolled manner. This uncontrolled deposition of resist fluid can cause damage to the wafer and otherwise create numerous process defects, including failed imprint, damage to existing wafer features, and risk of off-wafer contamination of other system components.

Figure 3A:
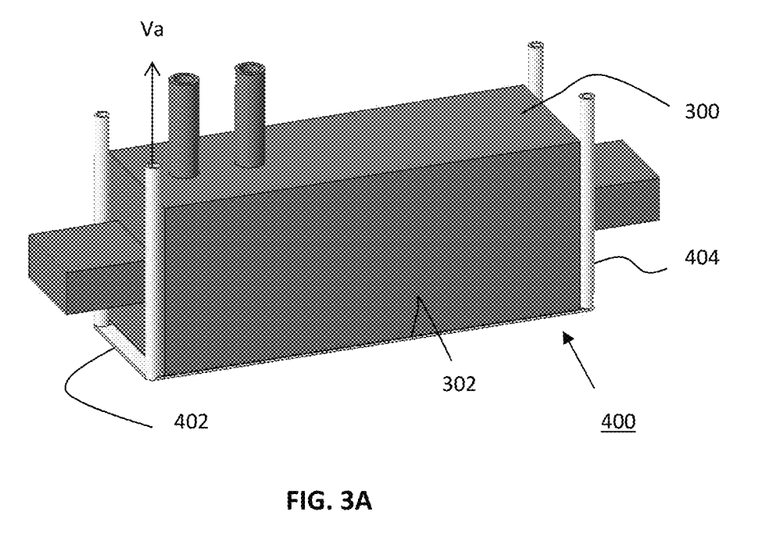
FIGS. 3A to 3C illustrate a fluid dispenser and a dispenser guard assembled with the fluid dispenser.
Figure 3B:
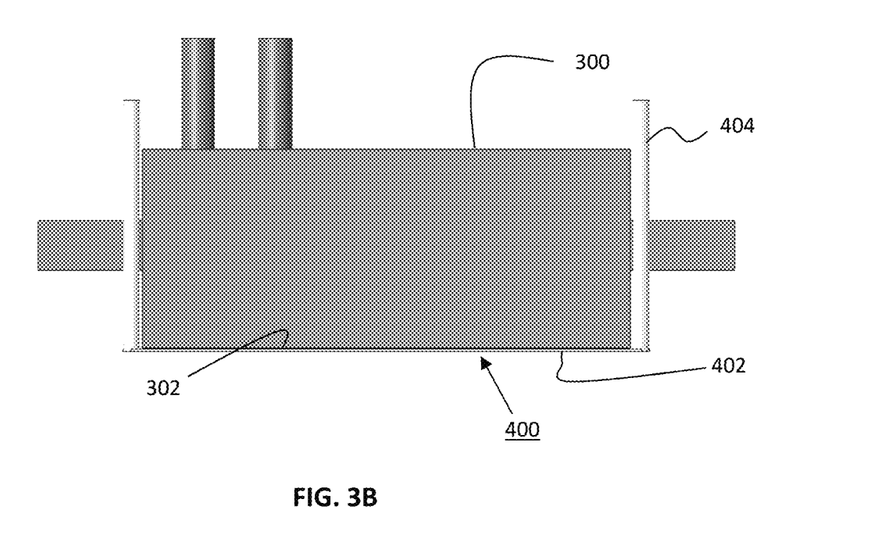
Figure 3C:
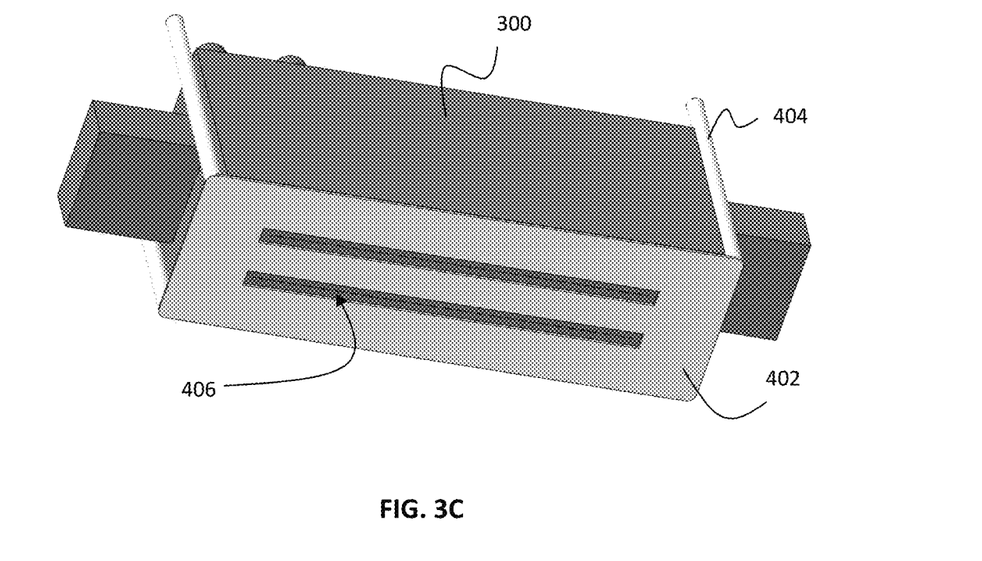

To prevent such excessive fluid accumulation on the faceplate of the dispenser 300, a dispenser guard is placed in close proximity of the faceplate 302 of the dispenser 300 as shown in FIGS. 3A to 3C. FIG. 3A shows a schematic drawing of a dispenser guard 400 for continuously removing fluid accumulation on the faceplate 302 of the dispenser 300. The dispenser guard 400 may include one or more vacuum tubes 404 and a main plate 402. In various embodiments, the dispenser guard 400 can be formed of a plastic, metal (such as stainless steel), ceramic material, or other material that is non-reactive with the dispensed resist. The dispenser guard 400 is attached to the faceplate 302 such that the main plate 402 is brought to overlap with the faceplate 302 of the dispenser 300. In one embodiment, the dispenser guard 400 is bonded at its perimeter to of the faceplate 302 using an adhesive. This creates a seal about the perimeter to avoid any vacuum leakage. FIG. 3B is a side view of the assembly of the dispenser 300 and the dispenser guard 400. In the embodiment as shown in FIG. 3C, the dispenser 300 includes two rows of nozzles 306 (see FIG. 4C) formed on the faceplate 302, and the main plate 402 of the dispenser guard 400 includes two elongate opening slits 406 aligned with the rows of nozzles respectively, such that the fluid ejected from the nozzles can be dispensed without being obstructed by the dispenser guard 400. As shown in FIG. 3A, a negative pressure or vacuum source $V_a$ can be used to apply a negative pressure or a vacuum to a perimeter location of the dispenser guard 400 to draw the fluid away from the faceplate 302, as further detailed herein.

As discussed above, during dispensing, fluid may accumulate around the nozzles on the faceplate due to various reasons. In order continuously remove the fluid accumulation before it becomes problematic, in one embodiment, the main plate 402 is positioned within a distance from the faceplate 302 to form a narrow gap between the main plate 402 of the dispenser guard 400 and the faceplate 302 of the dispenser 300. The gap is maintained narrow enough and the orientation of the opening slits 406 relative to the nozzle rows 306 is such that the fluid accumulation can be removed from the faceplate of the dispenser 300 by a capillary wicking effect. For example, the gap can be no bigger than 100 μm. Further to maintain adequate spacing between the dispenser guard 400 and the substrate during operation, in one example the total thickness of the main plate 402 and the gap is no thicker than 200 μm. The slits 406 can be of width such that the gap between the edge of the slit and the nozzle row is no more than 1 mm.

Figure 4A:
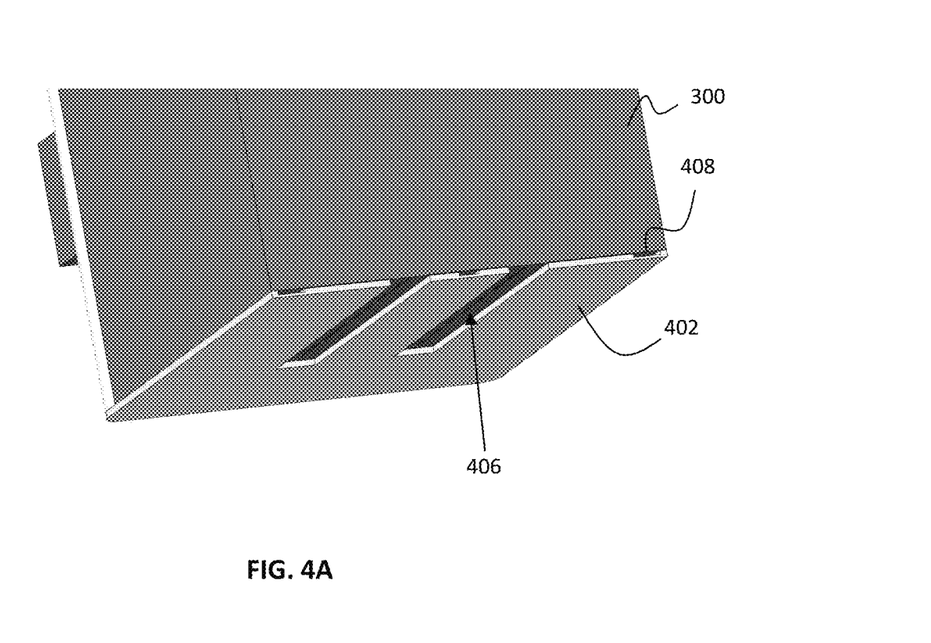
FIGS. 4A to 4D show enlarged views of partial structure of the dispenser guard.
Figure 4B:
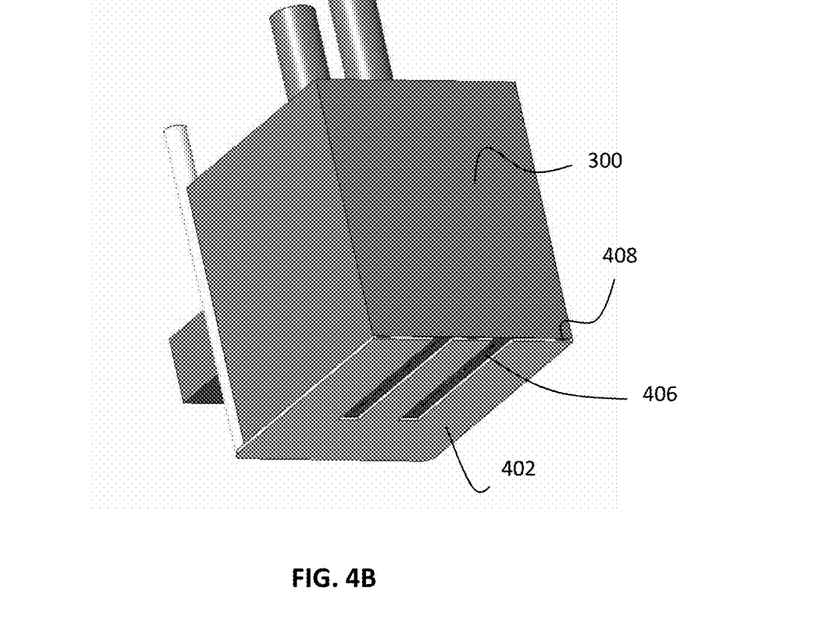
Figure 4C:
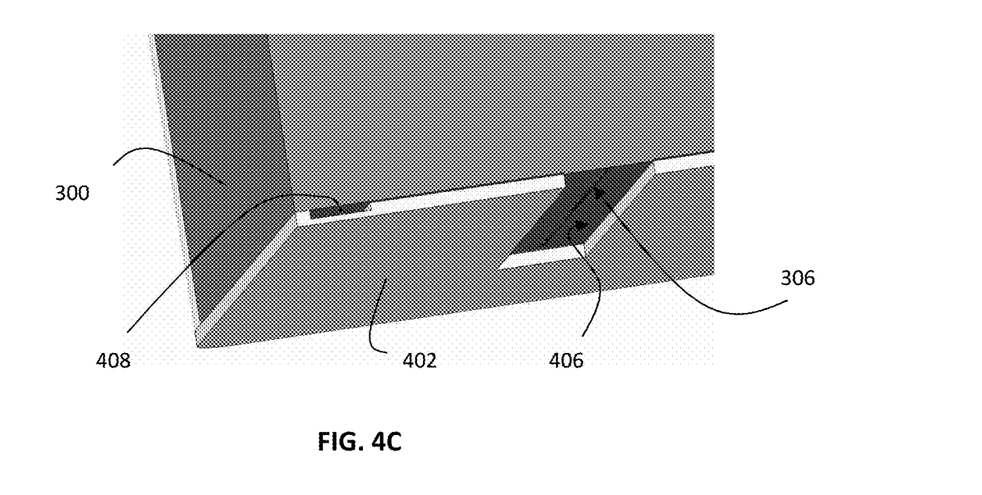
Figure 4D:
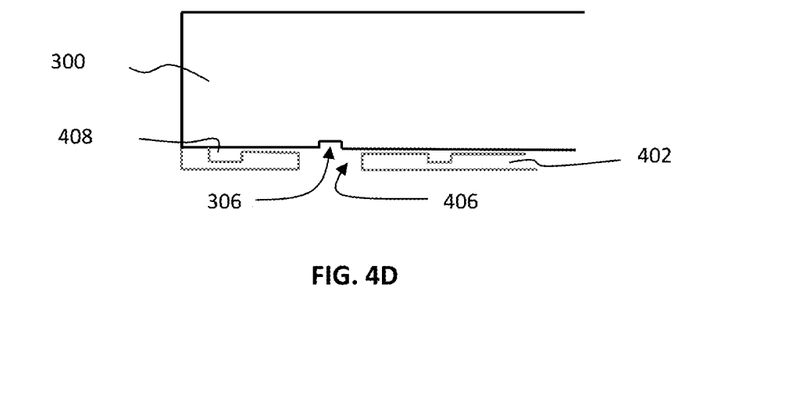

FIGS. 4A to 4C are enlarged views showing the partial structure of the main plate 402 of the dispenser guard 400 including draining structures. FIG. 4D shows a side view of FIG. 4C. As shown in FIGS. 4A to 4D, channels (or trenches) 408 are formed and recessed from the surface of the main plate 402 and the plate 402 is sealed against the dispenser faceplate 302 at the plate 402 perimeter. The channels 408 can be formed by etching, or laser engraving, or chemical machining or the like. In one embodiment, each of the channels 408 has a width less than 200 μm. The channels 408 and the openings 406 are alternately arranged in parallel. When the fluid accumulation around the nozzles is drawn away by capillary force, the channels 408 may function as fluid traps allowing the drawn off fluid to be trapped therein. Vacuum tubes 404 are provided in fluid communication with channels 408. By application of continuous or intermittent vacuum via vacuum source $V_a$, the accumulated fluid in channels 408 can be cleared. In an alternative embodiment, channels similar to channels 408 can instead be formed in the dispenser faceplate 302 and likewise connected to channels 408. In such a configuration, the opposing surface of the dispenser guard can be flat.

Figure 5A:
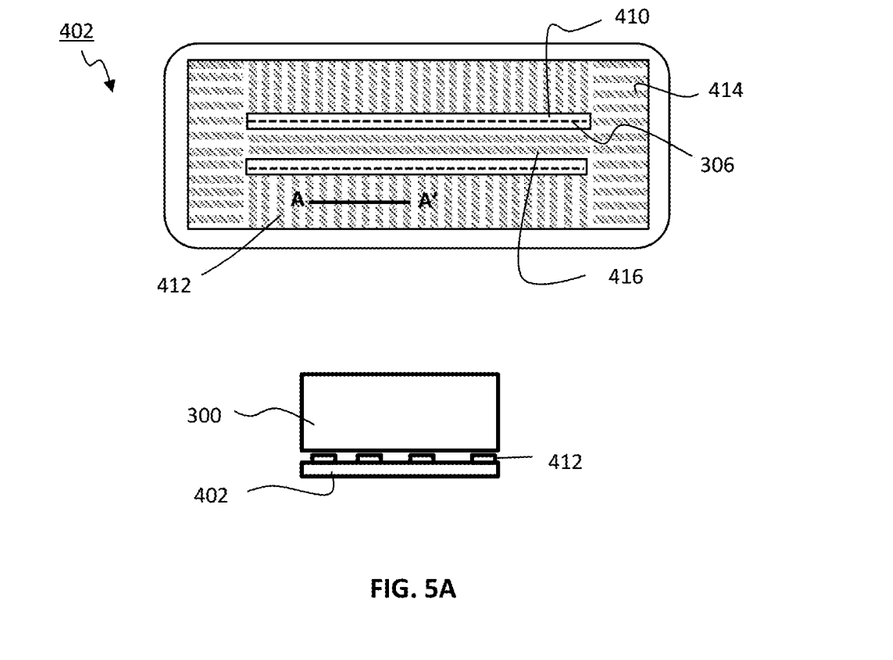
FIGS. 5A to 5D shows exemplary structures to enhance removal of fluid accumulation.

FIGS. 5A to 5D shows exemplary geometric structures formed on the main plate of the dispenser guard and surrounding the dispenser guard opening to enhance the capillary attraction for dispenser faceplate fluid accumulation. In the top view as shown in FIG. 5A, the main plate 402 of the dispenser guard 400 includes two opening slits 410 and a plurality of ribs surrounding each of the opening slits 410. The ribs can be formed using like methods as for channels 408. The plurality of ribs includes a first group of ribs 412, a second group of ribs 414, and a third group of ribs 416. As shown in FIG. 5A, the first group of ribs 412 is arranged into two rows extending along two elongate sides of the main plate 402, while each of the first group of ribs 412 elongates perpendicularly to the elongate side of the main plate 402. The second group of ribs 414 is arranged into two columns extending along two lateral sides of main plate 402. Each of the second group of ribs 414 elongates along the elongate side of the main plate. The first group of ribs 412 and second group of ribs 414 encompass the opening slits 416 therein. The third group of ribs 416 extends between and in parallel with the opening slits 416. The first, second, and third of groups ribs 412, 414, and 416 define a plurality of fine channels on the main plate 402 to enhance the capillary attraction of fluid accumulation and wicking fluid away from nozzle rows 306 to channels 408. A cross sectional view along the line AA' is provided in FIG. 5A to further illustrates the positional relationship between the dispenser 300 and the main plate 402.

Figure 5B:
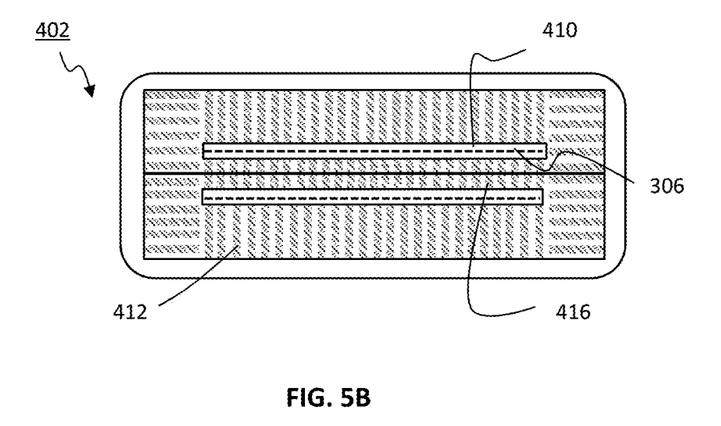
Figure 5C:
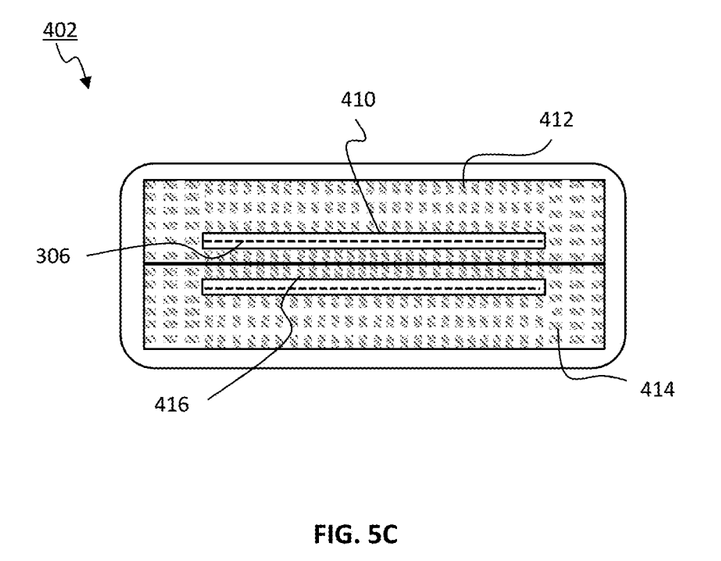
Figure 5D:
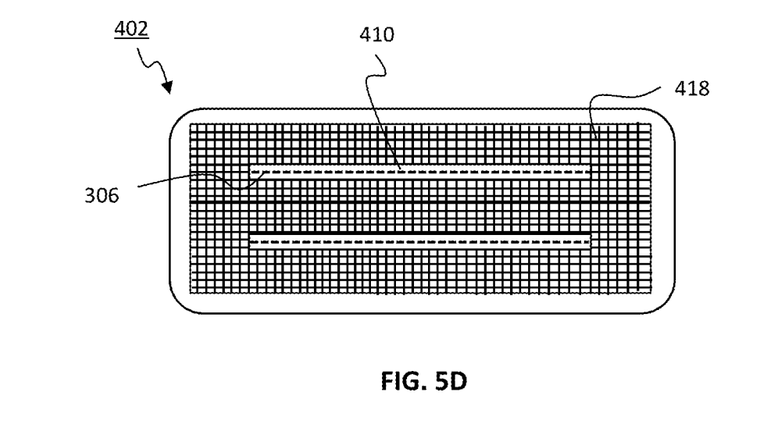

FIG. 5B illustrate a modification of the structure as shown in FIG. 5A. In FIG. 5B, the third group of ribs 416 includes two rows of ribs 416 that have a shorter length than the length of the first and second group ribs 412 and 414. The third group of ribs 416 as shown in FIG. 5B has the same orientation of the first group of ribs 412. In FIG. 5C, the first group of ribs 412 includes multiple rows of ribs, while the second group of ribs 414 includes multiple columns of ribs. In an alternative embodiment as shown in FIG. 5D, the main plate 402 of the dispenser guard 400 includes a mesh 418. In alternative embodiments, similar rib or mesh structures as in FIGS. 5A to 5D can be formed in the dispenser faceplate 302 itself. In such configurations, the opposing surface of dispenser guard can be flat, or can likewise include a corresponding configuration of rib or mesh structures or other complementary structures to enhance the capillary wicking effect.

As one of skill in the art will readily understand, capillary force can be defined by:

$$P = -\gamma \left[ \frac{\cos\theta_t + \cos\theta_b}{h} + \frac{\cos\theta_l + \cos\theta_r}{w} \right], \quad [1]$$

where P is the capillary pressure, γ is the surface tension of liquid in a microchannel, h, w, are the channel height and width respectively, and $\theta_t$, $\theta_b$, $\theta_l$, $\theta_r$ are the top, bottom, left, and right contact angles of liquid with the corresponding four microchannel walls. The channels defined by the ribs or mesh as shown in FIGS. 5A to 5D are thus designed in consideration with the equation [1]. For example, for a nanoimprint resist having a surface tension smaller than 36 mN/m, the target contact angle on a polyimide material may be configured to smaller than or equal to 5°.

Figure 6:
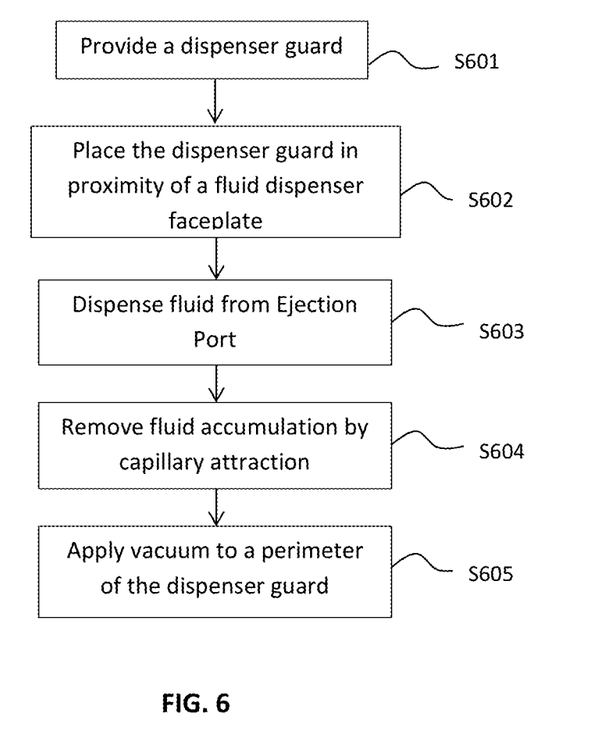
FIG. 6 is a process flow of a method of dispensing fluid using a dispenser guard.

FIG. 6 shows a process flow of a method for dispensing nanoimprint resist fluid in an imprint process. In step S601, a dispenser is provided, the dispenser having a dispenser guard positioned in proximity to the fluid dispenser faceplate and having an opening configured to allow for the dispensing of fluid from an ejection port of the dispenser. In step S603, a fluid is dispensed from the ejection port onto a substrate. In step S604, fluid accumulated around the ejection port is removed away by capillary force as the gap between the dispenser guard and the fluid dispenser is maintained sufficiently small. In step S605, vacuum pressure is applied to a drainage structure of the dispenser guard to draw away the fluid accumulation.

Figure 7:
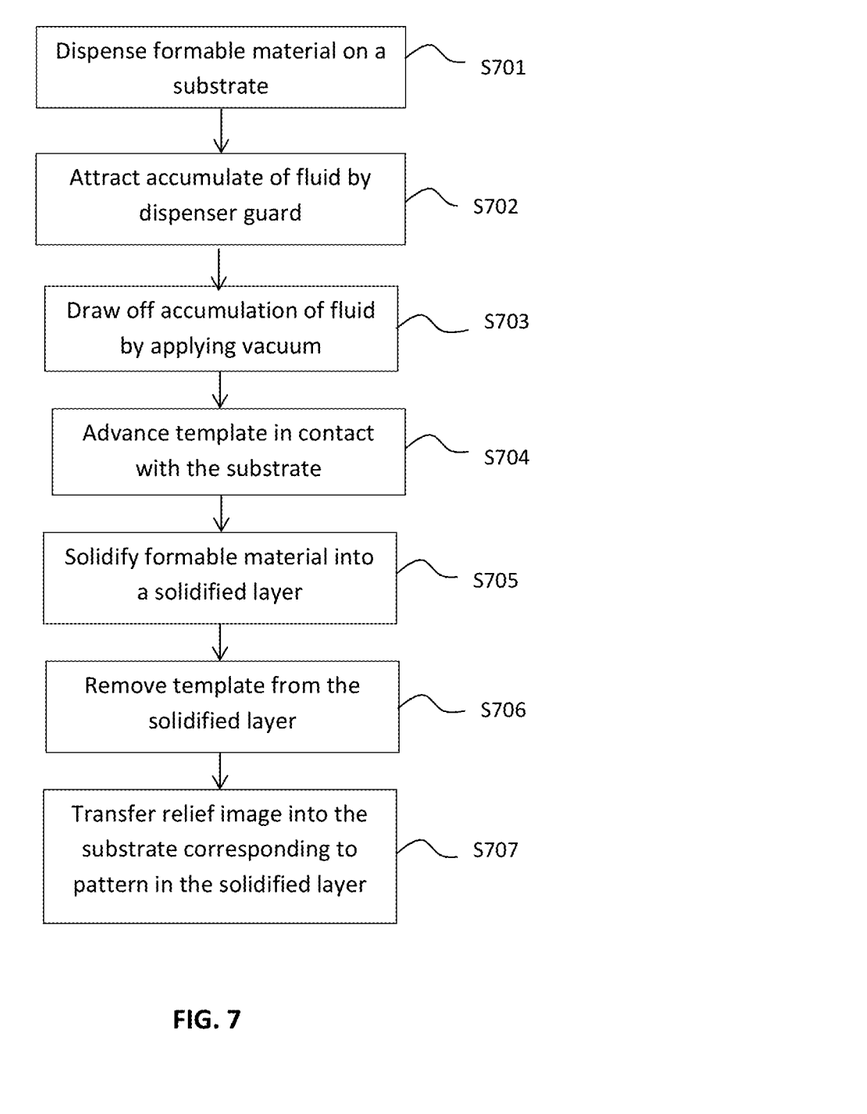
FIG. 7 is a process flow of a method of manufacturing an article.

FIG. 7 shows a process flow of a method of manufacturing an article, for example, a semiconductor device. In step S701 a formable material is dispensed from an ejection port of a dispensing surface of a fluid dispenser onto a substrate. In step S702, an accumulation of fluid on the dispensing surface may be attracted by a dispenser guard disposed in proximity of the dispensing surface. In step S703, a vacuum is applied to a perimeter of the dispenser guard to draw off the accumulation of fluid. In step S704, a template is advanced to be in contact with the fluid dispensed on the substrate. In step S705, the formable material is solidified to form a solid layer on the substrate that has a pattern conforming to a shape of the surface of the advanced template, and in step S706, the template is removed from the solidified layer. In step S707, the substrate with the solidified layer is processed to make the article. The processing in step S707 may include etching processes to transfer a relief image into the substrate that corresponds to a pattern formed in the solidified layer (or an inverse of that pattern). The processing in step S707 may also include known steps and processes for article fabrication, including, for example, curing, oxidation, layer formation, deposition, doping, planarization, etching, formable material removal, dicing, bonding, and packaging, and the like. The substrate may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A fluid dispenser, comprising:
    a dispenser faceplate having at least one ejection port; and
    a dispenser guard having at least one opening configured to allow fluid exiting from the ejection port to flow through and at least one drainage structure, wherein the dispenser guard is spaced from the faceplate with a gap less than about 100 µm to attract, by capillary wicking effect, the fluid accumulated around the ejection port to flow into the drainage structure.

2. The fluid dispenser of claim 1, wherein the dispenser guard has a thickness smaller than 200 µm.

3. The fluid dispenser of claim 1, wherein the at least one drainage structure includes a trench formed at a peripheral region of the dispenser guard.

4. The fluid dispenser of claim 1, wherein the faceplate or the dispenser guard comprises a plurality of geometric structures surrounding the opening.

5. The fluid dispenser of claim 4, wherein the plurality of geometric structures comprises:
    at least two rows of first ribs arranged along an elongate direction of the opening; and
    at least two columns of second ribs arranged at two lateral sides of the opening.

6. The fluid dispenser of claim 5, wherein each of the first ribs elongates perpendicularly to the elongating direction, and each of the second ribs elongates in parallel with the elongate direction.

7. The fluid dispenser of claim 1, further comprising a row of ejection ports, wherein:
    the opening of dispenser guard extending along the row of ejection ports; and
    the dispenser guard comprises a plurality of geometric structures surrounding the opening defining a plurality of channels.

8. The fluid dispensing of claim 7, wherein the plurality of geometric structures comprises:
    at least two rows of ribs arranged along two respective elongate sides of the opening; and
    at least two columns of ribs arranged along two respective lateral sides of the opening.

9. The fluid dispenser of claim 1, further comprising a plurality of rows of ejection ports, wherein the dispenser guard comprises:
- a plurality of openings each extending along a respective one of the rows of ejection ports; and
- a plurality of geometric structures surrounding each of the rows of ejection ports is surrounded by the geometric structures.

10. The fluid dispenser of claim 9, wherein the plurality of geometric structures comprises:
- a plurality of rows of first ribs each being arranged along an elongate direction of the opening;
- a plurality of columns of second ribs each being arranged along a direction perpendicular to the elongate direction of the opening, wherein
- the rows of first ribs and the columns of second ribs are so arranged that each of the opening is surrounded by the first ribs at two elongate sides and the second ribs along two lateral sides thereof.

11. The fluid dispenser of claim 10, wherein each of the first ribs arranged between the two openings have a length shorter than the other of the first ribs.

12. The fluid dispenser of claim 10, wherein the plurality of rows of first ribs and the openings are alternately arranged along the direction perpendicular to the elongate direction of the opening between the columns of the second ribs.

13. The fluid dispenser of claim 10, wherein the plurality of columns of ribs includes a first array at a first lateral side of the openings and a second array at a second lateral side of the openings.

14. The fluid dispenser of claim 1, wherein the dispenser guard further comprises a mesh surrounding the opening.

15. The fluid dispenser of claim 1, further comprising a negative pressure source configured to supply a negative pressure to the drainage structure.

* * * * *